(12) United States Patent
Bertness (10) Patent No.: US 6,249,124 B1
(45) Date of Patent: Jun. 19, 2001

(54) ELECTRONIC BATTERY TESTER WITH INTERNAL BATTERY

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/432,476

(22) Filed: Nov. 1, 1999

(51) Int. Cl.[7] .............................. H02J 7/00; G01N 27/416
(52) U.S. Cl. ........................... 324/426; 320/103; 320/134
(58) Field of Search ............................. 324/426; 320/103, 320/134

(56) References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,390,828 | 6/1983 | Converse et al. | 320/32 |

(List continued on next page.)

OTHER PUBLICATIONS

"Electrochemical Impedance Spectroscopy in Battery Development and Testing", *Batteries International*, Apr. 1997, pp. 59 and 62–63.

(List continued on next page.)

FOREIGN PATENT DOCUMENTS

| | | |
|---|---|---|
| 0 022 450 A1 | 1/1981 | (EP) . |
| 29 26 716 B1 | 1/1981 | (DE) . |
| 0 637 754 A1 | 2/1995 | (EP) . |
| 0 772 056 A1 | 5/1997 | (EP) . |

(List continued on next page.)

*Primary Examiner*—Peter S. Wong
*Assistant Examiner*—Gregory J Toatley, Jr.
(74) *Attorney, Agent, or Firm*—Westman, Champlin & Kelly, P.A.

(57) ABSTRACT

An electronic battery tester for testing a storage battery include storage battery test circuitry configured to receive power through a power input. An internal battery is configured to provide power to the power input of the storage battery test circuitry. A switch is provided to selectively couple the storage battery test circuitry to the internal battery such that the internal battery can be tested.

56 Claims, 6 Drawing Sheets

U.S. PATENT DOCUMENTS

| | | | |
|---|---|---|---|
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Lieberman | 324/436 |
| 4,743,855 | 5/1988 | Randin et al. | 324/430 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | MacIntyre et al. | 324/435 |
| 4,947,124 | 8/1990 | Hauser | 324/430 |
| 4,956,597 | 9/1990 | Heavvvvey et al. | 320/14 |
| 4,968,941 | 11/1990 | Rogers | 324/428 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,248 | 9/1992 | Alexandres et al. | 324/428 |
| 5,170,124 | 12/1992 | Blair et al. | 324/434 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,457,377 | 10/1995 | Jonsson | 320/5 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,585,728 | 12/1996 | Champlin | 324/427 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,717,336 | 2/1998 | Basell et al. | 324/430 |
| 5,757,192 | 5/1998 | McShane et al. | 324/427 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,821,756 | 10/1998 | McShane et al. | 324/430 |
| 5,831,435 | 11/1998 | Troy | 324/426 |
| 5,872,443 | 2/1999 | Williamson | 320/21 |
| 5,914,605 | 6/1999 | Bertness | 324/430 |
| 5,945,829 | 8/1999 | Bertness | 324/430 |

FOREIGN PATENT DOCUMENTS

| | | |
|---|---|---|
| 2 088 159 | 6/1982 | (GB) . |
| 59-017894 | 1/1984 | (JP) . |
| 59-17892 | 1/1984 | (JP) . |
| 59-17893 | 1/1984 | (JP) . |
| 59-17894 | 1/1984 | (JP) . |
| 60-225078 | 11/1985 | (JP) . |
| 03274479 | 12/1991 | (JP) . |
| 03282276 | 12/1991 | (JP) . |
| 04131779 | 5/1992 | (JP) . |
| 04372536 | 12/1992 | (JP) . |
| 5216550 | 8/1993 | (JP) . |
| WO 93/22666 | 11/1993 | (WO) . |
| WO 98/58270 | 12/1998 | (WO) . |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc.*, ANSI/IEEE Std. 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

ELECTRONIC BATTERY TESTER WITH INTERNAL BATTERY

BACKGROUND OF THE INVENTION

The present invention relates to electronic battery testers. More specifically, it relates to electronic battery testers which contain an internal power source.

Electronic battery testers are known in the art. Various examples of such batteries are described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; and U.S. Pat. No. 5,914,605, issued Jun. 22, 1999, entitled ELECTRONIC BATTERY TESTER.

Some battery testers are powered exclusively using power received from the battery under test. However, other battery testers require additional power, either for performing the battery test, when the battery under test is discharged and cannot operate the tester or for providing functionality when the battery tester is disconnected from the battery under test. One technique to provide such additional power is to use an internal battery to power the battery test circuitry. However, typically such battery testers have had limitations placed on their use due to the internal battery. For example, some testers have been required to be taken "off line" in order to charge the internal battery and cannot perform a battery test.

SUMMARY OF THE INVENTION

An electronic battery tester for testing a storage battery include storage battery test circuitry configured to receive power through a power input. An internal battery is configured to provide power to the power input of the storage battery test circuitry. A switch is provided to selectively couple the storage battery test circuitry to the internal battery such that the internal battery can be tested.

In another aspect, an electronic battery tester for testing a storage battery includes storage battery test circuitry configured to receive power through a power input. An internal battery is configured to provide power to the power input of the storage battery test circuitry. An AC power adaptor is configured to supply a charging current to the internal battery while the storage battery test circuitry is operational.

In another aspect, an electronic battery tester for testing a storage battery includes storage battery test circuitry configured to receive power through a power input. An internal battery is configured to provide power to the power input of the storage battery test circuitry. A power supply is configured to draw power from the storage battery and responsively generate a charging signal to charge the internal battery.

In another aspect, an electronic battery tester for testing a storage battery includes storage battery test circuitry configured to receive power through a power input. An internal battery is further configured to provide power to the power input of the storage battery test circuitry. The internal battery is configured to provide power to an automotive vehicle which contains the storage battery when the storage battery is disconnected from the automotive vehicle for replacement of the storage battery.

DETAILED DESCRIPTION OF ILLUSTRATIVE EMBODIMENTS

The present invention includes an electronic battery tester having an internal battery for powering storage battery test circuitry in situations where, for example, the storage battery does not have sufficient power to power the test circuitry or for powering the test circuitry when the circuitry is not connected to the storage battery. The invention includes an AC power adaptor for charging the internal battery which is configured such that the storage battery test circuitry can operate while connected for the AC power adaptor. Further, a power supply is provided for charging the internal battery using power received from the storage battery. This can be, for example, provided by a switch-mode power supply. A switch is provided for connecting the storage battery test circuitry to the internal battery such that a battery test can be performed on the internal battery to determine the condition and state of charge of the internal battery. In one aspect, the test uses four point Kelvin connections. In another aspect, a conductance based test is preferred.

If the storage battery being tested must be replaced, the battery tester can provide temporary power to a vehicle which contains the storage battery using power from the internal battery. This power is used to power internal devices in the vehicle such as devices which include a memory, i.e., radios, power seats, vehicle computers, etc.

A bar code reader can also be provided such that the battery tester can receive information such as information relating to the battery under test, the vehicle, the dealership, the technician, etc. through a bar code.

Another aspect includes surface charge removal circuit is also provided with the tester. The surface charge removal circuit removes a portion of the surface charge, either through an internal resistance or through application of an external load, and predicts the steady state value of the open circuit voltage by monitoring the rate of discharge.

Additional functionality is provided to the tester such as the capability to measure voltage, resistance, current, frequency, continuity or other parameters which may be useful to service personnel. The tester operates using a menu provided on a display. The menu includes "forward" and "back" functions such that the operator can easily navigate through a menu tree. A universal bracket is also provided such that the tester can be mounted on a cart, bench or a wall.

Figure 1:
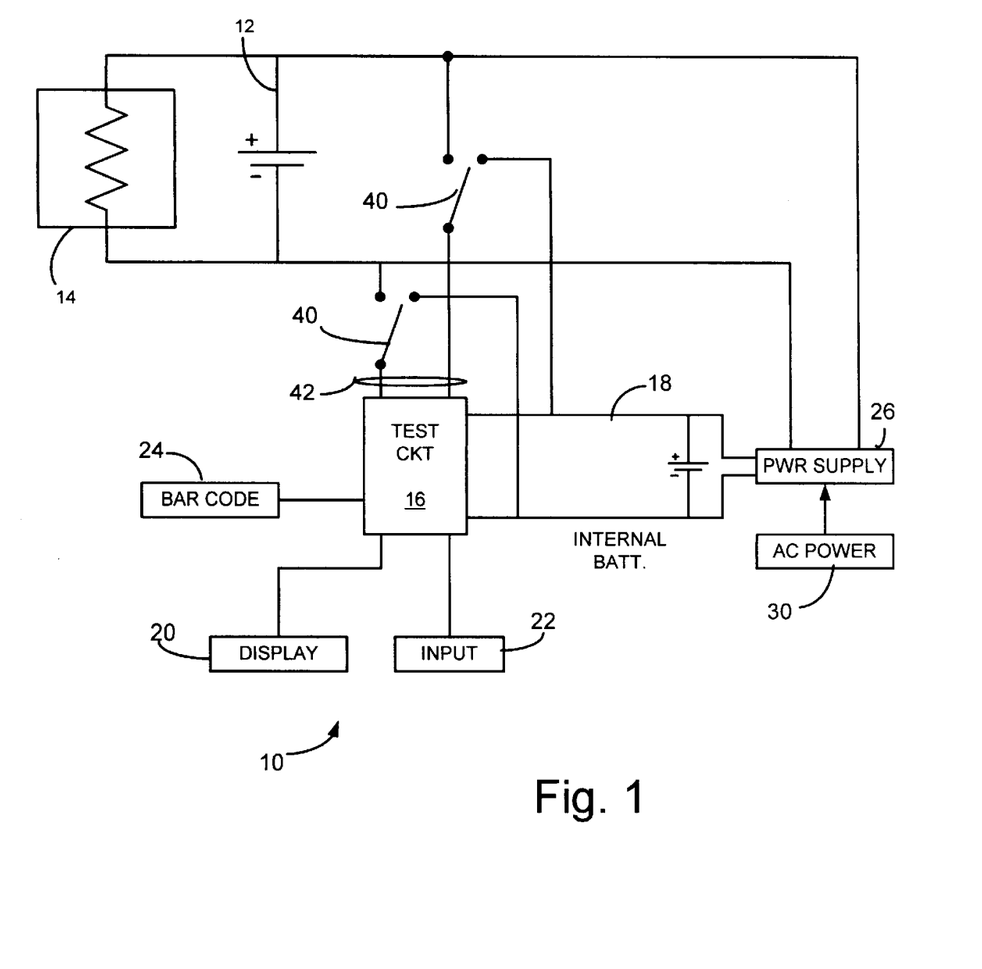
FIG. 1 is a simplified block diagram of an electronic battery tester in accordance with one embodiment.

FIG. 1 is a simplified block diagram showing electronic battery tester 10 coupled to a storage battery 12 of an automotive vehicle. Loads in vehicle 12 are represented by resistance 14. Battery tester 10 includes test circuitry 16, internal battery 18, display 20, input 22, bar code reader 24 and power supply 26. An AC power supply 30 is also provided.

In operation, test circuitry 16 performs a battery test on battery 12 in accordance with known techniques. For example, this can be a traditional load test or a more advanced conductance, impedance, resistance or admittance based test. These tests are merely examples and the invention is not limited to any particular testing technique. Test circuitry 16 operates in accordance with commands received through input 22 from an operator. Input 22 may be, for example, a key pad. Results and instructions are provided by test circuitry 16 using display 20.

During operation, AC power source 30 can be used by power supply 26 to charge internal battery 18. Power supply 26 can include charging circuitry such that its output is configured to properly charge battery 18. Further, while the internal battery 12 is being charged, test circuit 16 can still perform tests on battery 14. Internal power supply 26 can include a switch-mode power supply, draws power from storage battery 20 and provides a charging current to internal battery 18 when tester 10 is not connected to an AC source. Using switches 40 to couple internal battery 8 to test circuit input 42, typically operated under the control of test circuitry 16, test circuitry 16 can perform a battery test on internal battery 18. Based upon the results of this test, an output can be provided using display 20 indicating that the internal battery 18 should be recharged or replaced. In one preferred embodiment, this test is a conductance, impedance, admittance or resistance based test using four point Kelvin connections.

Using switches 40, it is also possible to connect internal battery 18 across resistive load 14 of the automotive vehicle. This allows the vehicle storage battery 12 to be removed or disconnected while maintaining power to the internal components in the vehicle. This can be advantageous, for example, such that devices with a memory in the vehicle (i.e., radios, clocks, power seats, etc.) can maintain power and thereby maintain their stored settings even when storage battery 12 is removed.

Bar code reader 24, is useful for inputting a large amount of information into test circuit 16. For example, information regarding the battery under test, the vehicle, the dealership, the technician or other information can be input using a bar code which is read by bar code reader 24.

Frequently when testing the electrical system of an automotive vehicle, a technician needs a number of instruments. In one preferred embodiment, test circuit 16 provides other testing functionality such as multi-meter functions (i.e., voltage, resistance, current, frequency, continuity, etc.). For example, this can be used to measure an AC frequency component impressed across the battery due to starter operation. This can be displayed, for example, an indication of starter RPM or the elapsed starter time. This can be configured using input 22 and the information can be displayed using display 20. Input 42 can be coupled to other devices to perform other testing functions.

Test circuitry 16 can step an operator through a series of steps using menu functions provided on display 20. The operator can select various options on the menu using input 22. In one preferred embodiment, the menu can be navigated using "forward" and "back" functions input using input device 22. This allows the operator to easily operate through the menu system.

Figure 2:
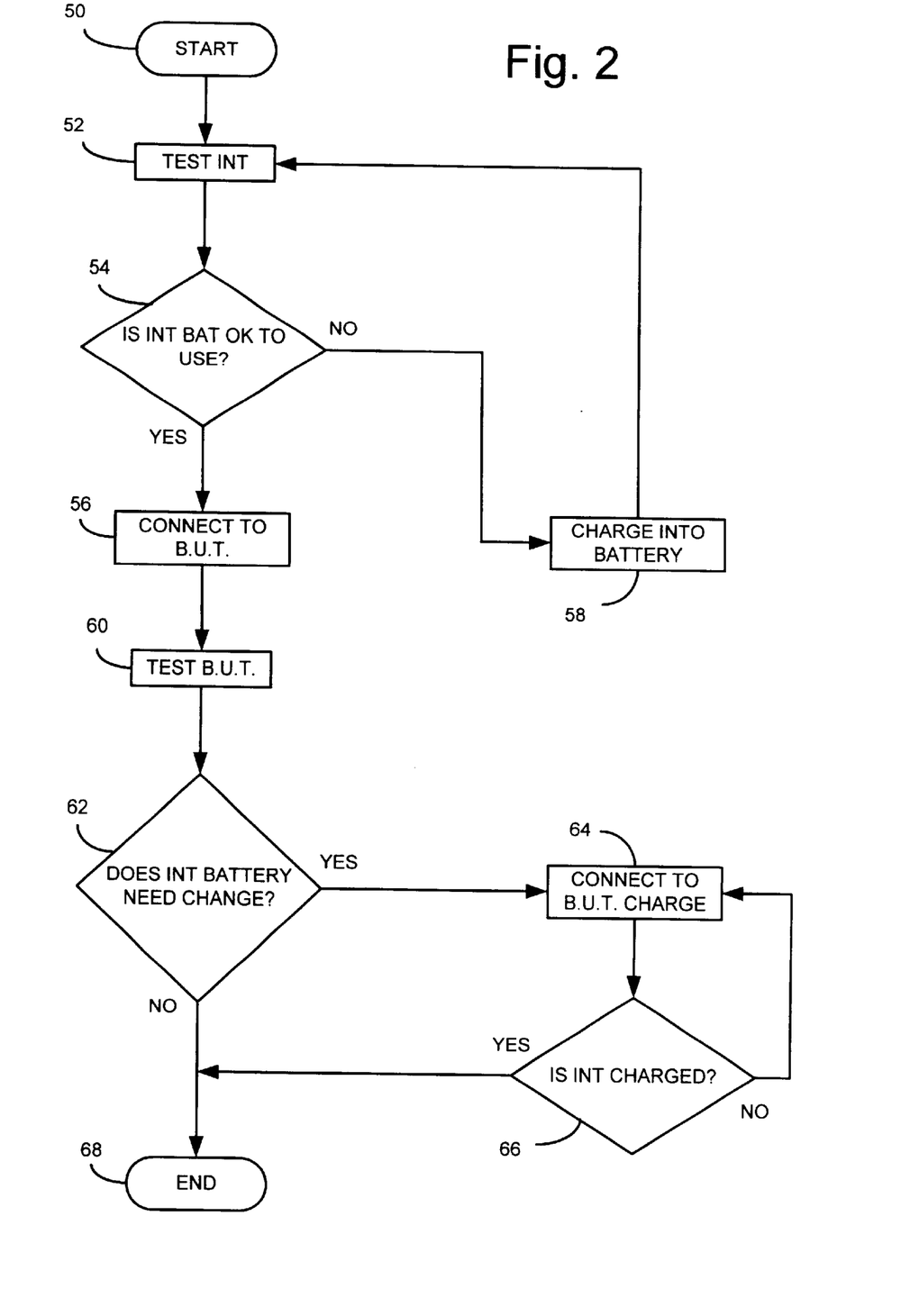
FIG. 2 is a flow chart showing steps in charging an internal battery of the battery tester of FIG. 1.

FIG. 2 is a simplified flow chart showing steps performed in the electronic battery tester 10 of FIG. 1 to charge the internal battery 18. In the flow chart of FIG. 2, the process is initiated at start block 50. At block 52 test circuitry 16 actuates switches 40 to perform a test on internal battery 18. At block 54, if the internal battery is sufficient for use in performing a test on battery 14, control is passed to block 56 and test circuitry 16 is coupled to battery 16 by switches 40. However, if the internal battery 18 is discharged, control is passed to block 58 and internal battery 18 is charged using AC power source 30. At block 60, test circuitry 16 actuates switches 40 to perform a test on the external Battery Under Test (BUT). Following completion of the test, control is passed to block 62 and test circuitry 16 adjusts switches 40 to perform a test on internal battery 18. If internal battery 18 requires charging, control is passed to block 64 and power supply 26 is used to charge internal battery 18 using power from the external Battery Under Test (BUT) 12. If the internal battery is not charged, block 66 returns control to block 64 and the charging continues. Once the charging is complete, control is passed to block 68 and the procedure terminates. At this time, an operator can be instructed to disconnect tester 10 from battery 12 by displaying instructions on display 20.

Figure 3:
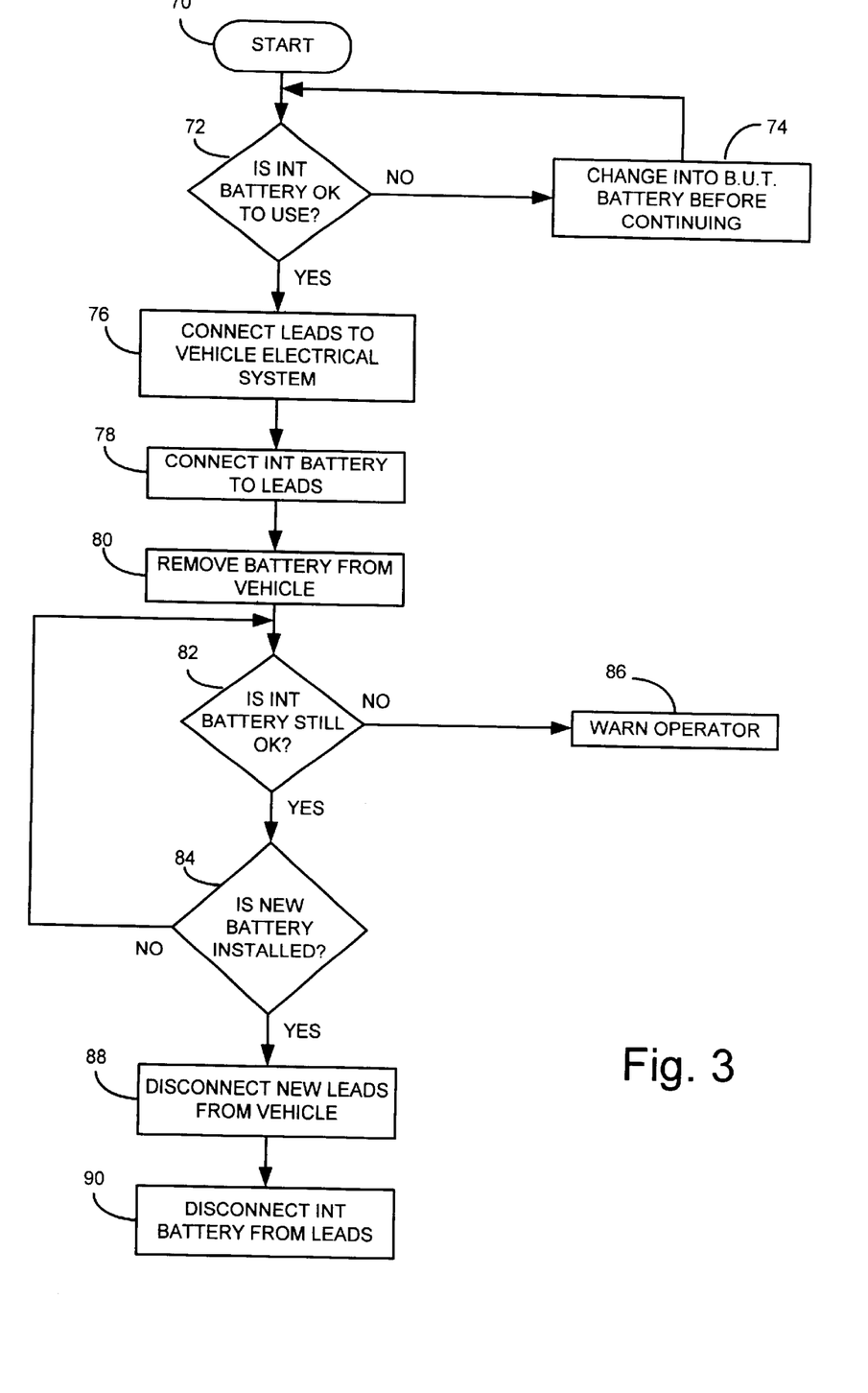
FIG. 3 is a flow chart showing steps performed when changing an external battery and powering an external load using the internal battery of the battery test circuitry of FIG. 1.

FIG. 3 is a simplified block diagram showing steps in which the internal battery 18 is used to provide power to loads 14 while the battery under test 12 is replaced. The flow chart begins at block 70. At block 72, test circuitry 16 actuates switches 40 to perform a test on internal battery 18. If the internal battery 18 fails the battery test, control is passed to block 74 and the internal battery 18 is charged. This charging can be through the use of AC power 30 or through the use of power from battery 12. Once battery 18 is sufficiently charged, control is passed to block 76 and the operator is instructed to couple the Kelvin connections 42 to the battery under test 12 if the operator has not previously done so. At block 78, switch 40 is actuated to connect internal battery 18 to the load 14. The operator is instructed at block 80 to proceed with disconnection of the internal battery 12. While the internal battery 12 is disconnected, test circuitry 16 cycles through blocks 82 and 84. At block 82, test circuitry 16 actuates switches 40 to test internal battery 18 (without disconnecting internal battery 18 from load 14). If the internal battery 18 is beginning to fail, a warning is provided to the operator using display 20 at block 86. At block 84, test circuitry 16 checks to see if a new battery 12 has been installed. If not, control is returned to block 82. Once the new battery 12 has been installed, control is passed to block 88 and the operator is instructed to disconnect the leads from the electrical system. At block 90, test circuitry 16 actuates switches 40 to disconnect the internal battery 18 from the external battery 12. In one aspect, display 20 is used to provide an output indicative of current drawn by the vehicle from internal battery 18.

Figure 4:
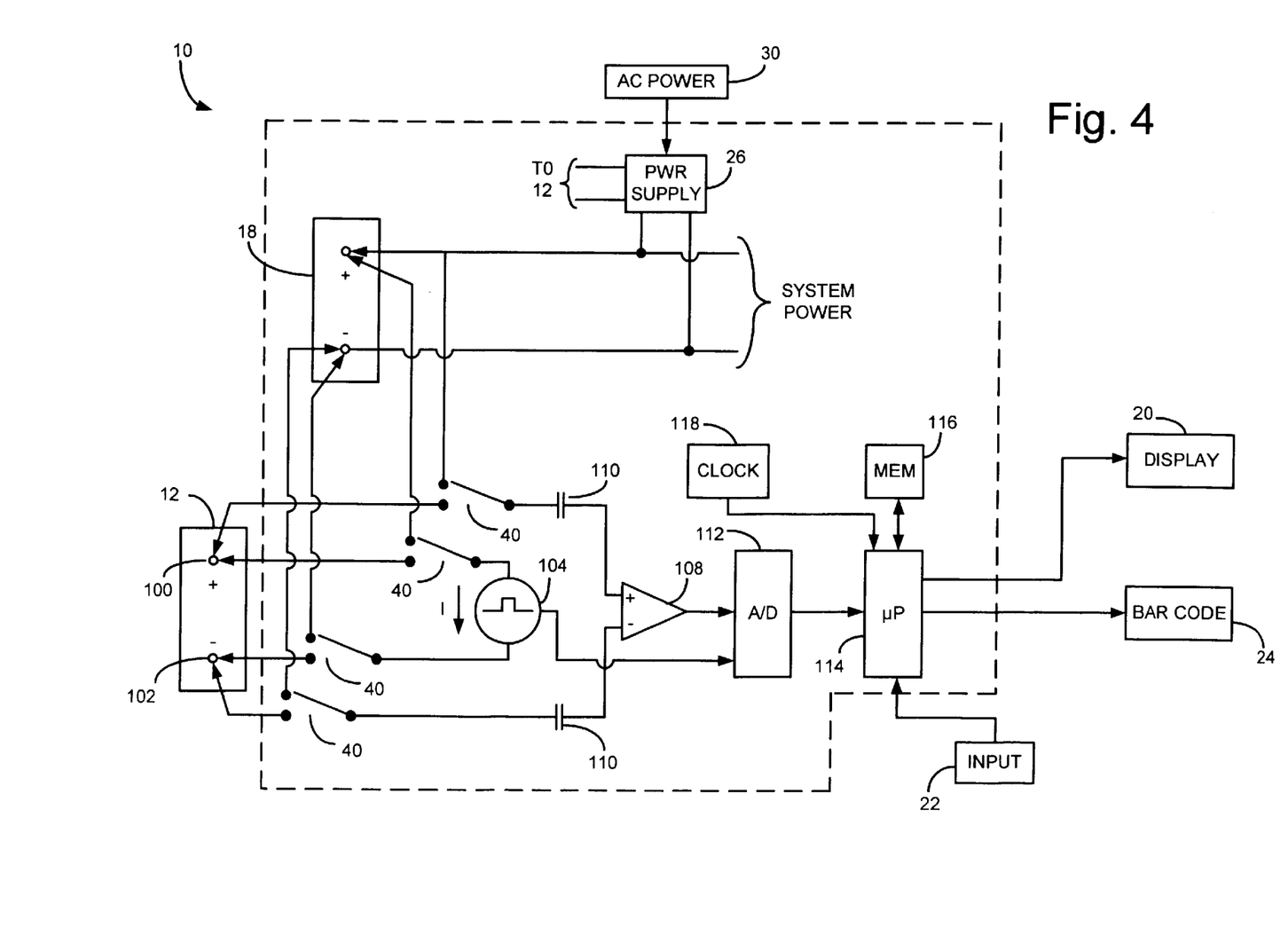
FIG. 4 is a simplified electrical schematic diagram showing electronic battery tester 10 in more detail.

FIG. 4 is a more detailed block diagram showing battery test circuitry 10. As illustrated in FIG. 4, Kelvin connections 42 couple to the positive terminal 100 and the negative terminal 102 of battery 12. Similarly, switches 40 can be actuated such that the Kelvin connections 42 couple to internal battery 18. Battery test circuitry 10 includes a forcing function source 104 illustrated as a current source which provides a forcing function to a first pair of terminals of the Kelvin connection 42. Typically, the forcing function includes an AC component. The second pair of terminals in the Kelvin connection 42 couple to amplifier 108 through capacitors 110. The output of amplifier 108 is provided to analog to digital convertor 112 which provides a digitized output signal to microprocessor 114. Microprocessor 114 operates under the control of programming instructions stored in memory 116 at a rate determined by system clock 118.

In operation, microprocessor 114 measures the response signal through the Kelvin connection 42 due to the applied forcing function from source 104. Source 104 can be an active source or it can be a resistive load. However, in general source 104 includes an AC component. Microprocessor 114 monitors the forcing function using analog to digital convertor 112. Similarly, microprocessor 114 measures the resultant response signal, for example a voltage signal using analog to digital converter 112. Microprocessor 114 calculates the conductance, G, using the equation:

$$G=I/V \qquad \text{Eq. 1}$$

where I is the forcing function current and V is the resultant response signal. Typically, I and V are the magnitudes of the AC components of the forcing function and response signals. However, in other embodiments, the phase difference between the signals are also used such that real and imaginary values can be determined. In addition to calculating G in other embodiments of the invention resistance, admittance or impedance can be calculated. For example, as described in patents by Dr. Keith S. Champlin or patents which are assigned to Midtronics, Inc. of Burr Ridge, Ill., this information can be used to determine information related to the condition of a battery. Various testing techniques are described in the following patents: U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; and U.S. Pat. No. 5,945,829, issued Aug. 31, 1999, entitled MIDPOINT BATTERY MONITORING.

In addition to programming instructions, memory 116 can contain stored information related to the ratings of a battery such as battery 12 or 18. This information can be permanently stored in memory 116 (for example, for battery 18) or can be input for a specific battery such as battery 12. Microprocessor 114 can make determinations about the condition of the battery by comparing measurements from the battery with the information stored in memory 116.

Figure 5:
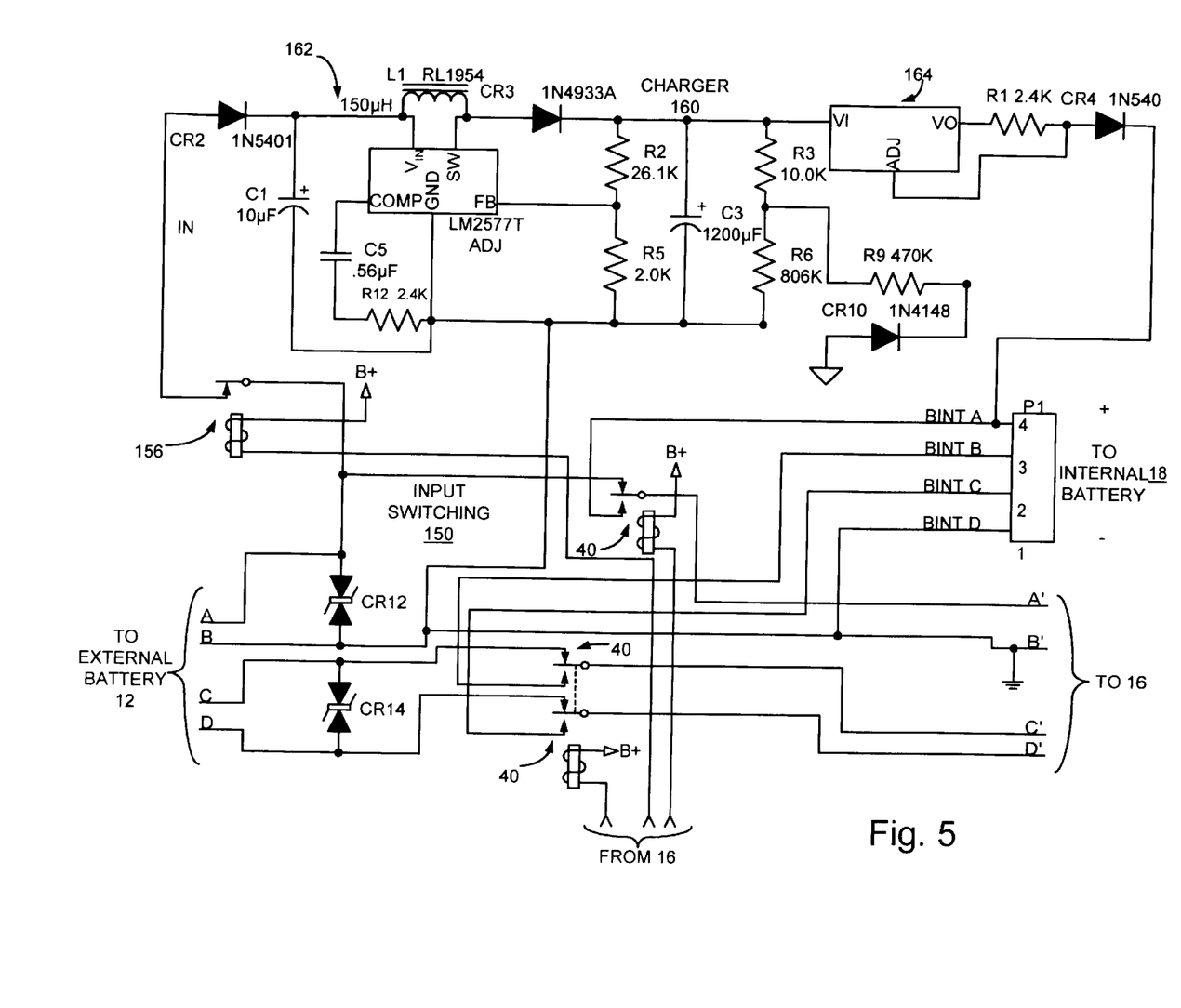
FIG. 5 is an electrical schematic diagram showing a switch in power supply used to charge the internal battery.

FIG. 5 is a simplified schematic diagram of a portion of power supply circuitry 26. For illustration, component numbers and part numbers are included in the Figure. Input switching circuitry 150 includes switches 40 and 156 which are used to switch the Kelvin connection coupling between the external battery 12 and the internal battery 18. The Kelvin connections are labeled A, B, C, and D for external battery 12, BINT A, BINT B, BINT C and BINT D for the internal battery 18 and A', B', C' and D' for coupling to test circuitry 16. Switch 156 is used for coupling charger circuitry 160 to external battery 12 to thereby charge internal battery 18. Charger 160 includes a switching power supply 162 which is illustrated as based upon a part number LM2577T. The input to switching power supply 162 should be greater than about 6 volts and less than about 15 volts. The output from switching power supply 162 is provided to voltage regulator circuitry 164 which uses a voltage regulator IC part number LM317T to provide regulated output to thereby charge the internal battery 18.

Figure 6:
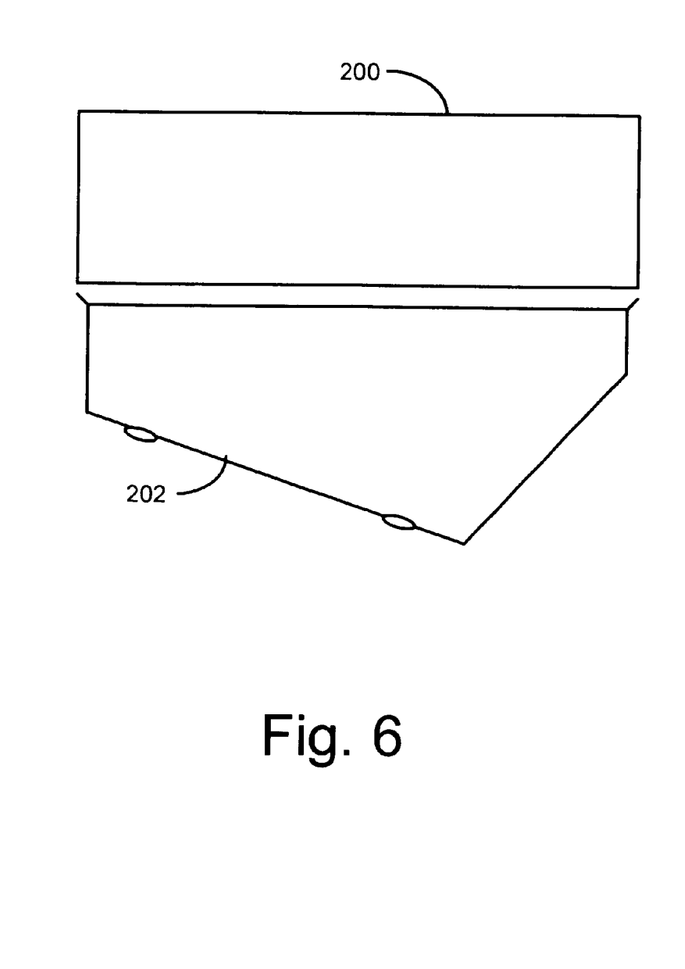
FIG. 6 is a side exploded perspective view of a battery tester housing and a battery tester mount.
Figure 7:
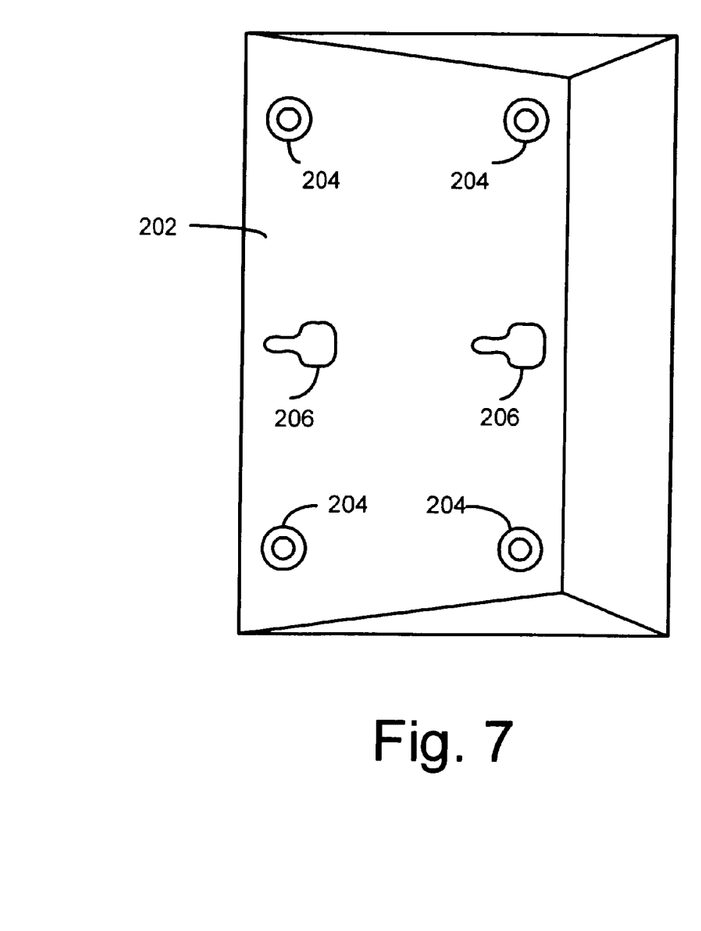
FIG. 7 is a bottom plan view of the battery tester mount of FIG. 6.

Another aspect of the invention includes a mount for mounting an electronic battery tester. FIG. 6 is a side plan view of battery tester housing 200 and housing mount 202. Housing 200 contains battery test circuitry 10. Mount 202 is used for mounting housing 200. FIG. 7 is a bottom plan view of mount 202. Pads 204 can be used when mount 202 is set on a flat surface. Further, mount 202 includes mounting holes 206 such that mount 202 can be positioned on a vertical surface such as a wall for more permanent mounting of housing 200. Housing 200 is releasably secured to mount 202 using, for example, clips or other attachment devices.

In another aspect of the present invention, the surface charge is removed or compensated prior to testing. The open circuit voltage of the battery can be used in conductance based testing to determine the state of charge of the battery. However, surface charge (or polarization) can provide an inaccurate reading of the open circuit voltage. Polarization can occur, for example, if the battery has just been charged or discharged. With the present invention, a portion of the surface charge is removed prior to testing. Test circuitry 16 can then predict the ultimate open circuit voltage after the polarization has been removed by examining the discharge curve of the battery. Removal of the open circuit voltage can be through an internal resistance within test circuitry 16 or through the operation of a load such as load 14 within the vehicle. For example, source 104 shown in FIG. 4 can be applied to the battery for an extended period to reduce the surface charge. This reduces the time required for removal of the polarization. This also reduces the size of the loads which must be applied.

Although the present invention has been described with reference to preferred embodiments, workers skilled in the art will recognize that changes may be made in form and detail without departing from the spirit and scope of the invention. In one embodiment, the internal battery 18 comprises a lead acid storage battery. However, other types of batteries such as Nickel Cadmium or Lithium Ion can also be used. Further, the specific type of test circuitry set forth herein is provided for illustrative purposes and the invention should not necessarily be limited to that embodiment. Any type of forcing function or battery test can be used with various aspects of the invention. The forcing function can be periodic, step or other wave forms or transients. Some aspects of the invention do not require the Kelvin connections set forth herein.

What is claimed is:

1. An electronic battery tester for testing a storage battery, comprising:
    storage battery test circuitry having test connections configured to test a battery, the storage battery test circuitry configured to receive power through a power input;
    an internal battery configured to provide power to the power input of the storage battery test circuitry; and
    a switch configured to selectively couple test connections of the storage battery test circuitry to the internal battery to thereby configure the test circuitry to test the internal battery.

2. The electronic battery tester of claim 1 including an AC power adaptor configured to supply a charging signal to the internal battery.

3. The electronic battery tester of claim 2 wherein the AC power adaptor is configured to supply the charging signal to the internal battery while the storage battery test circuitry is operational.

4. The electronic battery tester of claim 1 wherein the test connections comprise a Kelvin connection.

5. The electronic battery tester of claim 3 wherein the battery test circuitry includes a forcing function source applied between a pair of connections in the Kelvin connection and the battery test is performed as a function of the forcing function and a resultant signal measured between a second pair of connections of the Kelvin connection.

6. The electronic battery tester of claim 5 wherein the forcing function comprises a load.

7. The electronic battery tester of claim 5 wherein the battery test is a function of conductance G of the battery.

8. The electronic battery tester of claim 1 including a power supply configured to draw power from the storage battery and responsively generate a charging signal to charge the internal battery.

9. The electronic battery tester of claim 8 wherein the power supply includes a switch mode power supply.

10. The electronic battery tester of claim 1 including a display configured to provide information to an operator.

11. The electronic battery tester of claim 10 wherein the display is configured to provide a menu, the electronic battery tester further including an input configured to receive forward and back commands for navigation through the menu.

12. The electronic battery tester of claim 1 including a mount configured to mount the battery tester vertically, the mount further configured to support the battery tester in a horizontal position.

13. The electronic battery tester of claim 1 wherein the internal battery is configured to provide power to an automotive vehicle which contains the storage battery when the storage battery is disconnected from the automotive vehicle.

14. The electronic battery tester of claim 1 including a bar code reader for receiving information relating to the storage battery.

15. The electronic battery tester of claim 1 wherein the storage battery test circuitry includes a load for selectively removing surface charge from the storage battery to thereby determine a steady state value of the open circuit voltage of the battery.

16. The electronic battery tester of claim 15 wherein only a portion of the surface charge is removed and the storage battery test circuitry predicts the steady state open circuit voltage.

17. The electronic battery tester of claim 1 wherein the storage battery test circuitry is configured to provide and display measured voltage, resistance or current.

18. The electronic battery tester of claim 1 wherein the storage battery test circuitry is configured to measure a frequency and display an output related to the measured frequency.

19. The electronic battery tester of claim 18 wherein the frequency is due to an AC voltage impressed on the battery due to starter operation, the frequency related to starter RPM.

20. An electronic battery tester for testing a storage battery, comprising:
    storage battery test circuitry having test connections configured to test a battery, the storage battery test circuitry configured to receive power through a power input;
    an internal battery configured to provide power to the power input of the storage battery test circuitry; and
    a power supply configured to draw power from the storage battery and responsively generate a charging signal to charge the internal battery.

21. The electronic battery tester of claim 20 including an AC power adaptor configured to supply a charging signal to the internal battery.

22. The electronic battery tester of claim 21 wherein the AC adapted is configured to supply the charging signal to the internal battery while the storage battery test circuitry is operational.

23. The electronic battery tester of claim 20 wherein the battery circuitry couples to a battery through a test Kelvin connection.

24. The electronic battery tester of claim 23 wherein the battery test circuitry includes a forcing function source applied between a pair of connections in the Kelvin connection and the battery test is performed as a function of the forcing function and a resultant signal measured between a second pair of connections of the Kelvin connection.

25. The electronic battery tester of claim 24 wherein the forcing function comprises a load.

26. The electronic battery tester of claim 24 wherein the battery test is a function of conductance G of the battery.

27. The electronic battery tester of claim 20 including a display configured to provide information to an operator.

28. The electronic battery tester of claim 27 wherein the display is configured to provide a menu, the electronic battery tester further including an input configured to receive forward and back commands for navigation through the menu.

29. The electronic battery tester of claim 20 including a mount configured to mount the battery tester vertically, the mount further configured to support the battery tester in a horizontal position.

30. The electronic battery tester of claim 20 wherein the power supply includes a switch mode power supply.

31. The electronic battery tester of claim 20 wherein the internal battery is configured to provide power to an automotive vehicle which contains the storage battery when the storage battery is disconnected from the automotive vehicle.

32. The electronic battery tester of claim 31 includes a display configured to display a current supplied to the automotive vehicle from the internal battery.

33. The electronic battery tester of claim 20 including a bar code reader for receiving information relating to the storage battery.

34. The electronic battery tester of claim 20 wherein the storage battery test circuitry includes a load for selectively removing surface charge from the storage battery to thereby determine a steady state value of the open circuit voltage of the battery.

35. The electronic battery tester of claim 33 wherein only a portion of the surface charge is removed and the storage battery test circuitry predicts the steady state open circuit voltage.

36. The electronic battery tester of claim 20 wherein the storage battery test circuitry is configured to provide and display measured voltage, resistance or current.

37. The electronic battery tester of claim 20 wherein the storage battery test circuitry is configured to measure a frequency and display the measured frequency.

38. An electronic battery tester for testing a storage battery, comprising:
   storage battery test circuitry having test connections configured to test a battery, the storage battery test circuitry configured to receive power through a power input;
   an internal battery configured to provide power to the power input of the storage battery test circuitry; and
   wherein the internal battery is configured to provide power to an automotive vehicle which contains the storage battery when the storage battery is disconnected from the automotive vehicle.

39. The electronic battery tester of claim 38 including an AC power adaptor configured to supply a charging signal to the internal battery.

40. The electronic battery tester of claim 39 wherein the AC adapted is configured to supply the charging signal to the internal battery while the storage battery test circuitry is operational.

41. The electronic battery tester of claim 38 wherein test circuitry couples to a battery through a Kelvin connection.

42. The electronic battery tester of claim 41 wherein the battery test circuitry includes a forcing function source applied between a pair of connections in the Kelvin connection and the battery test is performed as a function of the forcing function and a resultant signal measured between a second pair of connections of the Kelvin connection.

43. The electronic battery tester of claim 42 wherein the forcing function comprises a load.

44. The electronic battery tester of claim 42 wherein the battery test is a function of conductance G of the battery.

45. The electronic battery tester of claim 38 including a power supply configured to draw power from the storage battery and responsively generate a charging signal to charge the internal battery.

46. The electronic battery tester of claim 45 wherein the power supply includes a switch mode power supply.

47. The electronic battery tester of claim 38 including a display configured to provide information to an operator.

48. The electronic battery tester of claim 47 wherein the display is configured to provide a menu, the electronic battery tester further including an input configured to receive forward and back commands for navigation through the menu.

49. The electronic battery tester of claim 38 including a mount configured to mount the battery tester vertically, the mount further configured to support the battery tester in a horizontal position.

50. The electronic battery tester of claim 38 including a bar code reader for receiving information relating to the storage battery.

51. The electronic battery tester of claim 38 wherein the storage battery test circuitry includes a load for selectively removing surface charge from the storage battery to thereby determine a steady state value of the open circuit voltage of the battery.

52. The electronic battery tester of claim 51 wherein only a portion of the surface charge is removed and the storage battery test circuitry predicts the steady state open circuit voltage.

53. The electronic battery tester of claim 38 wherein the storage battery test circuitry is configured to provide and display measured voltage, resistance or current.

54. The electronic battery tester of claim 38 wherein the storage battery test circuitry is configured to measure a frequency and display the measured frequency.

55. The electronic battery tester of claim 38 wherein the battery test circuitry tests the condition of the internal storage battery prior to providing power to the automotive vehicle.

56. The electronic battery tester of claim 38 including a display configured to display a current supplied to the automotive vehicle from the internal battery.

* * * * *